United States Patent
Ma

(10) Patent No.: US 9,391,191 B2
(45) Date of Patent: Jul. 12, 2016

(54) TRENCH FET HAVING MERGED GATE DIELECTRIC

(71) Applicant: International Rectifier Corporation, El Segundo, CA (US)

(72) Inventor: Ling Ma, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 70 days.

(21) Appl. No.: 14/095,198

(22) Filed: Dec. 3, 2013

(65) Prior Publication Data

US 2014/0167153 A1   Jun. 19, 2014

Related U.S. Application Data

(60) Provisional application No. 61/737,055, filed on Dec. 13, 2012.

(51) Int. Cl.
  *H01L 29/78* (2006.01)
  *H01L 29/40* (2006.01)
  *H01L 29/66* (2006.01)
  *H01L 29/423* (2006.01)

(52) U.S. Cl.
  CPC .......... *H01L 29/7813* (2013.01); *H01L 29/407* (2013.01); *H01L 29/4236* (2013.01); *H01L 29/66734* (2013.01)

(58) Field of Classification Search
  CPC .............. H01L 29/7813; H01L 29/66734; H01L 29/407; H01L 29/4236; H01L 29/402; H01L 29/404
  USPC .......... 257/329, 330, 340, 341, 401, E29.757, 257/E21.413
  See application file for complete search history.

(56) References Cited

U.S. PATENT DOCUMENTS

| | | | |
|---|---|---|---|
| 7,465,986 B2 | 12/2008 | Girdhar | |
| 2007/0138547 A1* | 6/2007 | Nakamura | 257/331 |
| 2013/0134505 A1* | 5/2013 | Kobayashi | 257/330 |
| 2013/0334565 A1* | 12/2013 | Hutzler et al. | 257/139 |

* cited by examiner

Primary Examiner — Galina Yushina
(74) Attorney, Agent, or Firm — Farjami & Farjami LLP

(57) ABSTRACT

In one implementation, a trench field-effect transistor (trench FET) includes a semiconductor substrate having a drain region, a drift zone over the drain region, and depletion trenches formed over the drain region. Each depletion trench includes a depletion trench dielectric and a depletion electrode. The trench FET can further include a respective bordering gate trench situated alongside each depletion trench, each bordering gate trench having a gate electrode and a gate dielectric. The gate dielectric is merged with the depletion trench dielectric between the depletion electrode and the gate electrode.

10 Claims, 7 Drawing Sheets

TRENCH FET HAVING MERGED GATE DIELECTRIC

BACKGROUND

The present application claims the benefit of and priority to a provisional application entitled "Vertical MOSFET Having Merged Gate and Source Trench Dielectric," Ser. No. 61/737,055 filed on Dec. 13, 2012. The disclosure in this provisional application is hereby incorporated fully by reference into the present application.

BACKGROUND ART

Group IV power transistors, such as silicon based trench type field-effect transistors (trench FETs) are used in a variety of applications. For example, silicon based trench metal-oxide-semiconductor FETs (trench MOSFETs) may be used to implement a power converter, such as a synchronous rectifier, or a direct current (DC) to DC power converter.

For many trench FET applications, it is desirable to reduce the on-resistance ($R_{dson}$) of the transistor. In addition, in applications for which high switching speeds are necessary or desirable, it may also be advantageous to reduce gate charge ($Q_g$), so as to reduce switching loss. However, conventional strategies for reducing on-resistance, such as increasing channel density for example, typically not only increase gate charge, but may undesirably increase the product of on-resistance and gate charge (i.e., $R_{dson}*Q_g$) as well.

SUMMARY

The present disclosure is directed to a trench field-effect transistor having a merged gate dielectric, substantially as shown in and/or described in connection with at least one of the figures, and as set forth more completely in the claims.

DETAILED DESCRIPTION

Figure 1:
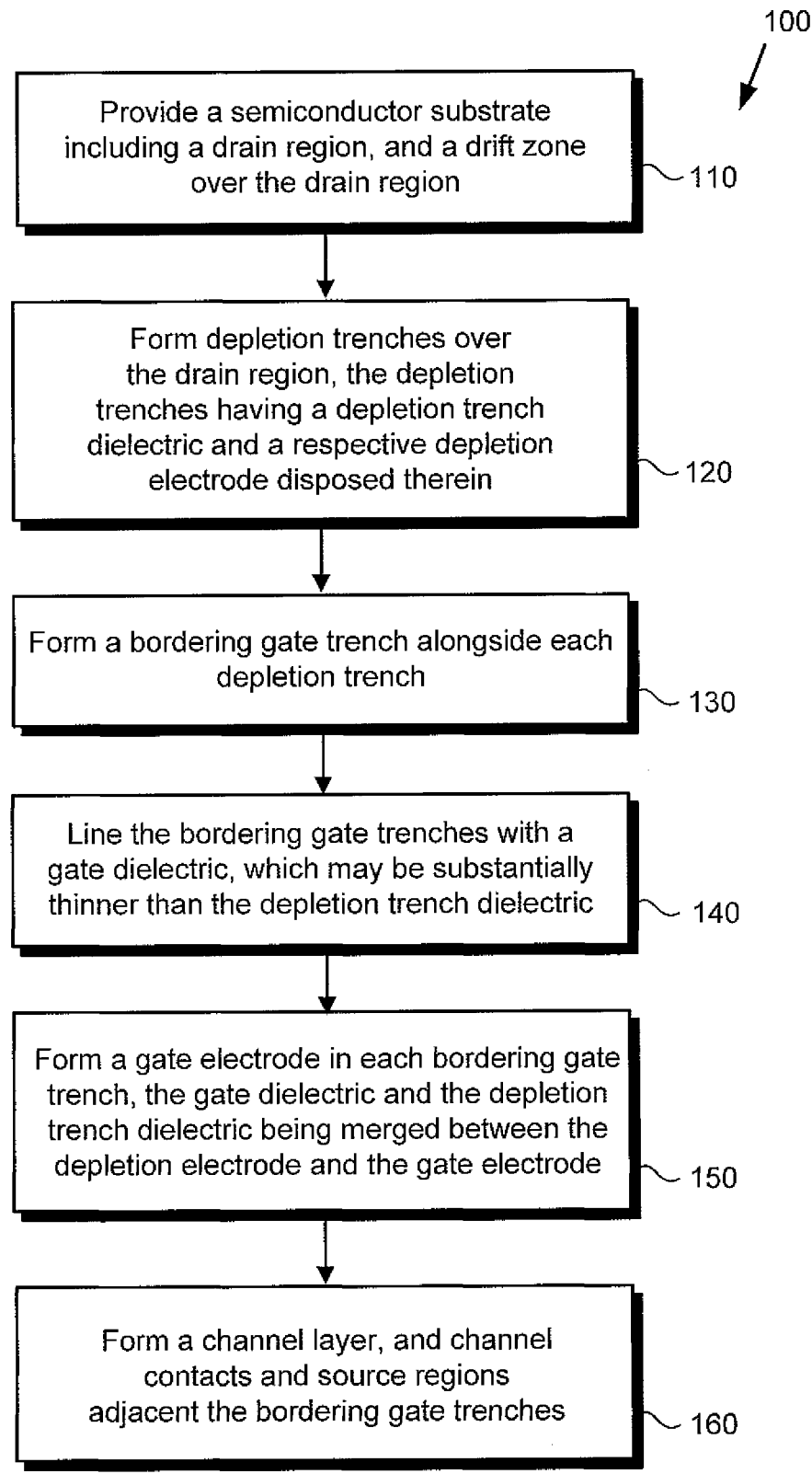
FIG. 1 shows a flowchart presenting one exemplary method for fabricating a trench field-effect transistor (trench FET) having a merged gate dielectric.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, group IV power transistors, such as silicon based trench type field-effect transistors (trench FETs) are used in a variety of applications. For example, silicon based trench metal-oxide-semiconductor FETs (trench MOSFETs) may be used to implement a power converter, such as a synchronous rectifier, or a direct current (DC) to DC power converter. For many trench FET applications, it is desirable to reduce the on-resistance ($R_{dson}$) of the transistor. Moreover, in applications for which high switching speeds are necessary or desirable, it may also be advantageous to reduce gate charge ($Q_g$), so as to reduce switching loss. However, conventional strategies for reducing on-resistance, such as increasing channel density for example, typically not only increase gate charge, but may undesirably increase the product of on-resistance and gate charge (i.e., $R_{dson}*Q_g$) as well.

The present application discloses a group IV trench FET and a method for its fabrication that reduces $Q_g$, and in many implementations concurrently reduces the product $R_{dson}*Q_g$. For example, in one implementation, a depletion trench including a depletion trench dielectric and a depletion electrode is bordered by a gate trench including a gate electrode and a gate dielectric substantially thinner than the depletion trench dielectric. By merging a portion of the gate dielectric with the depletion trench dielectric between the depletion electrode and the gate electrode, the capacitance between the gate electrode and the silicon or other group IV layer in which the gate trench is situated can be reduced. As a result, $Q_g$ for the trench FET can be reduced, enhancing performance for virtually all high frequency switching applications. In addition, in many applications, including those requiring a MOSFET operating voltage of approximately eighty volts (80 V) to approximately 100 V, or higher, the implementations disclosed herein also advantageously result in a reduction in the product $R_{dson}*Q_g$.

Referring to FIG. 1, FIG. 1 shows flowchart 100 presenting an exemplary method for fabricating a trench FET having a merged gate dielectric, according to one implementation. It is noted that the method described by flowchart 100 is performed on a portion of a processed semiconductor wafer or die, which may include, among other features, a silicon substrate and an epitaxially grown silicon layer, for example.

With respect to FIGS. 2A through 2F, structures 210 through 260 shown respectively in those figures illustrate the result of performing the method of flowchart 100 on a semiconductor structure, such as a portion of a semiconductor substrate. For example, structure 210 shows a portion of the semiconductor substrate including a drain region and a drift zone over the drain region (110), structure 220 shows structure 210 after formation of depletion trenches lined by a depletion trench dielectric and having respective depletion electrodes disposed therein (120), structure 230 shows structure 220 after formation a bordering gate trench alongside each depletion trench (130), and so forth.

It is noted that although FIGS. 2A through 2F depict fabrication of an n-channel field-effect transistor (NFET) in silicon, that representation is merely exemplary. In other implementations, other group IV semiconductors can be utilized, such as strained or unstrained germanium, for example. Moreover, in some implementations, the present concepts can be adapted to fabricate a p-channel FET (PFET).

Figure 2A:
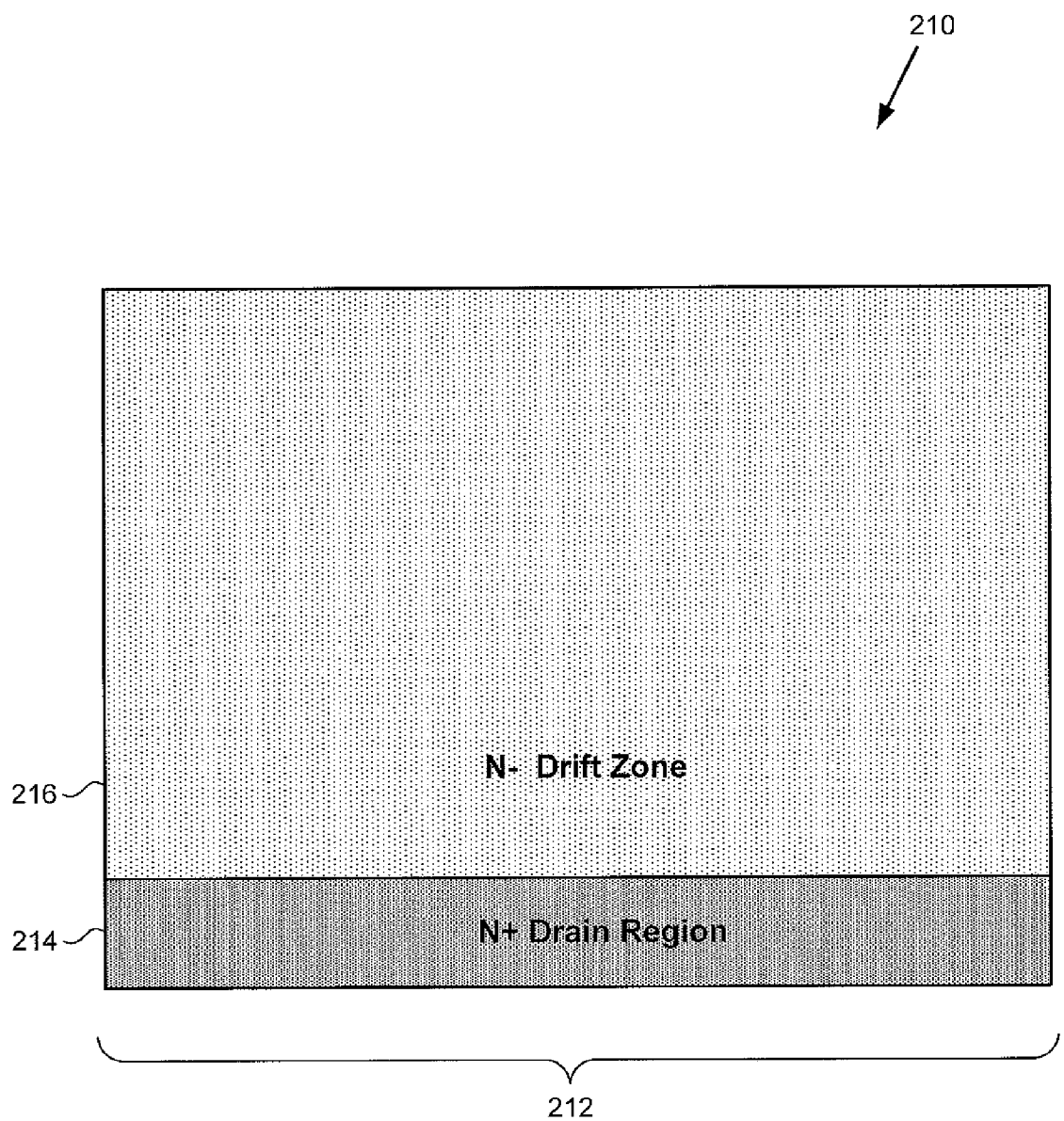
FIG. 2A shows an exemplary structure corresponding to an initial stage of the method described in FIG. 1.

Referring to structure 210, in FIG. 2A, in combination with flowchart 100, in FIG. 1, flowchart 100 begins with providing semiconductor substrate 212 including drain region 214, and drift zone 216 over drain region 214 (110). According to the exemplary implementation of FIG. 2A, drain region 214 is shown as an N+ drain region, and drift zone 216 is shown as an N− drift zone situated over drain region 214. Semiconductor substrate 212 may be a silicon substrate, for example, and may include drift zone 216 formed as an epitaxial silicon layer disposed over drain region 214. Formation of an epitaxial silicon layer may be performed by any suitable method, as known in the art, such as chemical vapor deposition (CVD) or molecular beam epitaxy (MBE), for example.

More generally, however, drift zone 216 may be formed as any suitable group IV layer included in semiconductor structure 210. Thus, in other implementations, drift zone 216 need not be formed of silicon. For example, in one alternative implementation, drift zone 216 can be formed in either a strained or unstrained germanium layer formed over drain region 214 of semiconductor substrate 212. Moreover, in some implementations, structure 210 may include additional layers, such as a buffer or field stop layer having the same conductivity type as drain region 214 and drift zone 216, and situated between drain region 214 and drift zone 216 (buffer or field stop layer not shown in FIG. 2A).

Figure 2B:
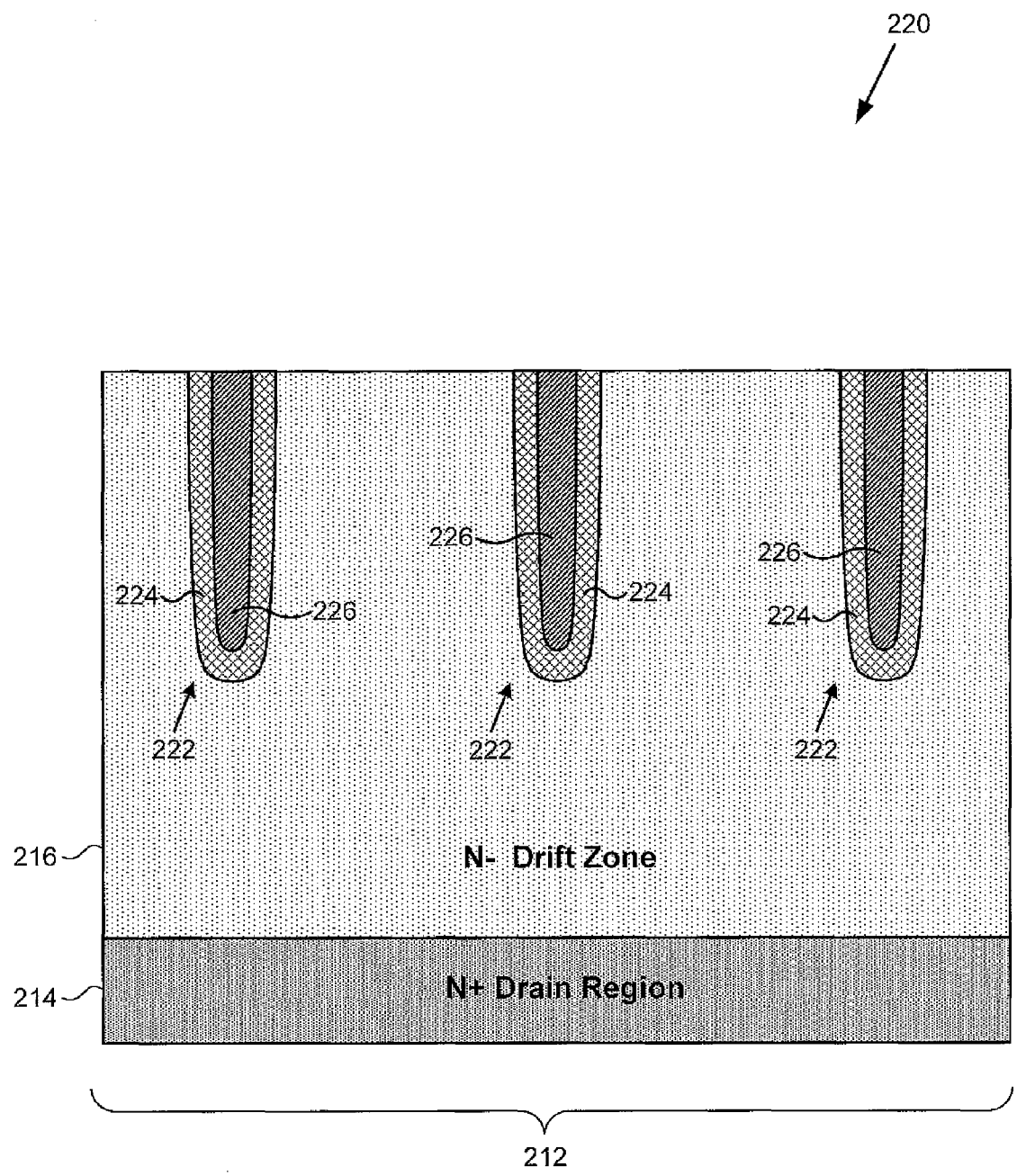
FIG. 2B shows the exemplary structure in FIG. 2A at an intermediate stage of the method described in FIG. 1.

Continuing to refer to flowchart 100, in FIG. 1, with additional reference to structure 220, in FIG. 2B, flowchart 100 continues with forming depletion trenches 222 over drain region 214, depletion trenches 222 having depletion trench dielectric 224 and respective depletion electrodes 226 disposed therein (120). Formation of depletion trenches 222 can be performed using any techniques known in the art. For example, in one implementation, a photoresist layer may be deposited over drift zone 216 and may be lithographically patterned to provide a mask for formation of depletion trenches 222 (photoresist layer not shown). Thereafter, a suitable etch process may be utilized to form depletion trenches 222. An example of a suitable etch process for formation of depletion trenches 222 is a dry etch process, such as a plasma etch.

Depletion trench dielectric 224 may be formed using any material and any technique typically employed in the art. For example, depletion trench dielectric 224 may be an oxide, such as silicon oxide ($SiO_2$), or a nitride, such as silicon nitride ($Si_3N_4$), and may be deposited or thermally grown to produce depletion trench dielectric 224. In some implementations, for example, depletion trench dielectric 224 may be a $SiO_2$ layer thermally grown to a thickness in a range from approximately 3000 angstroms (3000 Å) to approximately 6000 Å.

Depletion electrodes 226 may also be formed using any material and any technique typically utilized in the art. For example, depletion electrodes 226 may be formed of conductive polysilicon or metal.

Figure 2C:
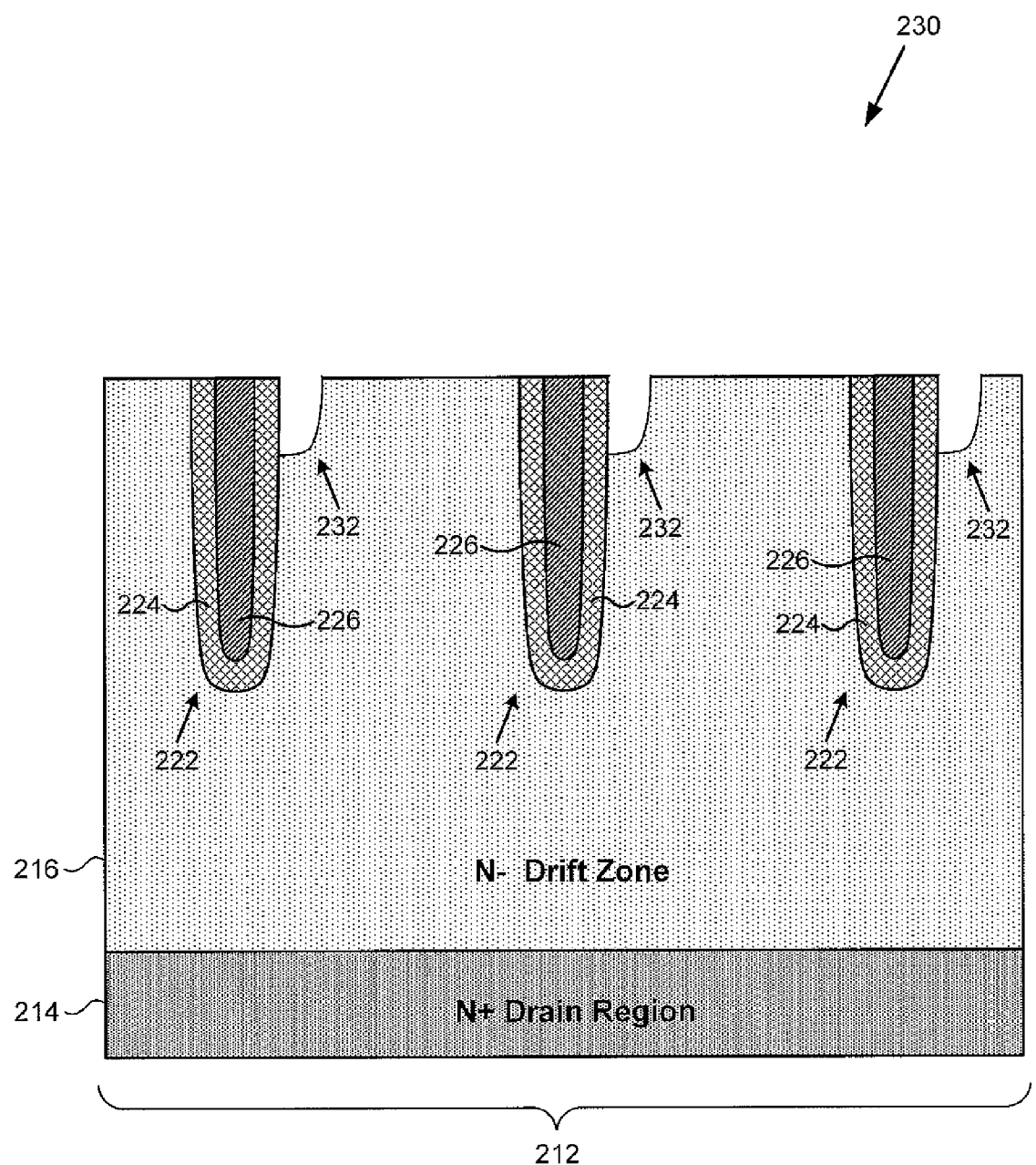
FIG. 2C shows the exemplary structure in FIG. 2B at another intermediate stage of the method described in FIG. 1.

Referring now to structure 230, in FIG. 2C, in combination with FIG. 1, flowchart 100 continues with formation of a bordering gate trench 232 alongside each of depletion trenches 222 (130). Formation of bordering gate trenches 232 can be performed using any techniques known in the art. For example, in one implementation, a photoresist layer may be deposited over semiconductor structure 220, in FIG. 2B, and may be lithographically patterned to provide a mask for formation of bordering gate trenches 232, in FIG. 2C (photoresist layer not shown). Thereafter, a suitable etch process, such as a plasma etch, or other dry etch process, may be utilized to form bordering gate trenches 232.

As shown in FIG. 2C, depletion trenches 222 extend beyond bordering gate trenches 232 into drift zone 216. In other words, depletion trenches 222 are substantially deeper than bordering gate trenches 232. For example, in some implementations, depletion trenches 222 may be from approximately one and a half times deeper to approximately twice as deep as bordering gate trenches 232. Moreover, in some implementations, it may be advantageous or desirable for depletion trenches 222 to be more than twice as deep as bordering gate trenches 232.

According to the implementation shown in FIG. 2C, bordering gate trenches 232 are formed adjacent only one side of respective depletion trenches 222. In other words, in some implementations, not more than one bordering gate trench 232 is situated alongside each of depletion trenches 222. As a result, the disposition of bordering gate trenches 232 may be substantially asymmetrical with respect to respective depletion trenches 222.

It is noted that, although in the exemplary implementation shown in FIG. 2C bordering gate trenches 232 are aligned so as to adjoin respective depletion trenches 222, that need not always be the case. For example, and as will be explained in greater detail below, the present method can tolerate some misalignment of bordering gate trenches 232 with their respective depletion trenches 222. Consequently, under some circumstances, bordering gate trenches 232 may be spaced apart from their respective depletion trenches 222 by a thin portion of drift zone 216, in structure 230.

Figure 2D:
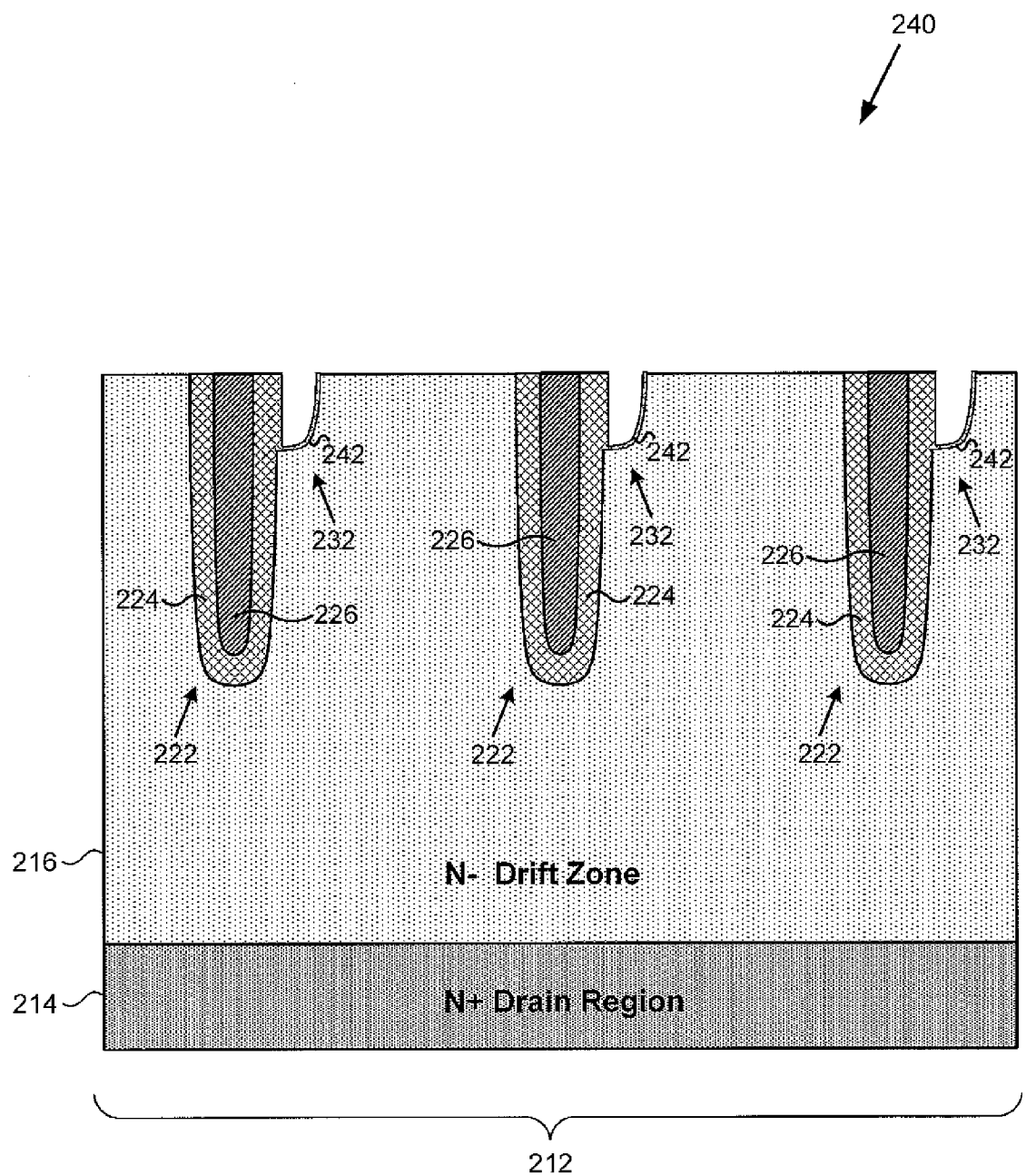
FIG. 2D shows the exemplary structure in FIG. 2C at another intermediate stage of the method described in FIG. 1.

Moving to structure 240 in FIG. 2D with ongoing reference to FIG. 1, flowchart 100 continues with lining of bordering gate trenches 232 with gate dielectric 242, which may be substantially thinner than depletion trench dielectric 224 (140). In some implementations, as shown in FIG. 2D, gate dielectric 242 may be formed of the same material used to form depletion trench dielectric 224. Moreover, in those implementations, gate dielectric 242 may be formed using the same technique utilized for formation of depletion trench dielectric 224.

That is to say, gate dielectric 242 may be formed as a thermally grown oxide, such as silicon oxide. However, it is noted that even when formed of substantially the same dielectric material and formed using substantially the same fabrication technique, gate dielectric 242 may be distinguishable from depletion trench dielectric 224 by being formed as a substantially thinner dielectric layer than depletion trench dielectric 224. As a specific example of the foregoing, depletion trench dielectric 224 may be may be a $SiO_2$ layer formed to a thickness in a range from approximately 3000 Å to approximately 6000 Å, as noted above. When similarly formed as a thermally grown $SiO_2$ layer, gate dielectric 242 may be grown to a thickness of approximately 500 Å to approximately 1000 Å, for example.

Alternatively, gate dielectric 242 may be a high dielectric constant (high-κ) dielectric suitable for use in a high-κ metal gate process. That is to say, for example, gate dielectric 242 may be formed of a metal oxide such as hafnium oxide ($HfO_2$), zirconium oxide ($ZrO_2$), or the like. Moreover, gate dielectric 242 can be formed by depositing a high-κ dielectric material, such as $HfO_2$ or $ZrO_2$ so as to line bordering gate trenches 232, utilizing a physical vapor deposition (PVD) process, CVD, or other suitable deposition process.

Together, gate dielectric 242 and depletion trench dielectric 224 merge to provide gate insulation for bordering gate trenches 232. As noted above, the present method is designed to tolerate some degree of misalignment between bordering gate trenches 232 and depletion trenches 222. For example, where no misalignment occurs, formation of bordering gate trenches 232 exposes respective portions of depletion trench dielectric 224 on one side of depletion trenches 222. Subsequently, formation of gate dielectric 242 results in gate dielectric 242 being merged with depletion trench dielectric 224 at their interface. The merger of gate dielectric 242 with depletion trench dielectric 224 provides gate insulation for bordering gate trenches 232.

Similarly, where a slight misalignment of bordering gate trenches 232 and depletion trenches 222 shifts bordering gate trenches 232 closer to respective depletion trenches 222, formation of bordering gate trenches 232 exposes portions of depletion trench dielectric 224. Once again, subsequent formation of gate dielectric 242 results in gate dielectric 242 being merged with depletion trench dielectric 224 to provide gate insulation for bordering gate trenches 232.

However, where a slight misalignment of bordering gate trenches 232 and depletion trenches 222 shifts bordering gate trenches 232 away from their respective depletion trenches 222, formation of bordering gate trenches 232 may not expose portions of depletion trench dielectric 224. Instead, a thin portion of drift zone 216 (e.g., silicon) may be situated between bordering gate trenches 232 and depletion trench dielectric 224 of their respective depletion trenches 222. Nevertheless, formation of gate dielectric 242 will typically result in oxidation of the intervening silicon, resulting in merger of gate dielectric 242 with depletion trench dielectric 224. Thus, yet again, formation of gate dielectric 242 can result in gate dielectric 242 being merged with depletion trench dielectric 224 to provide gate insulation for bordering gate trenches 232.

Figure 2E:
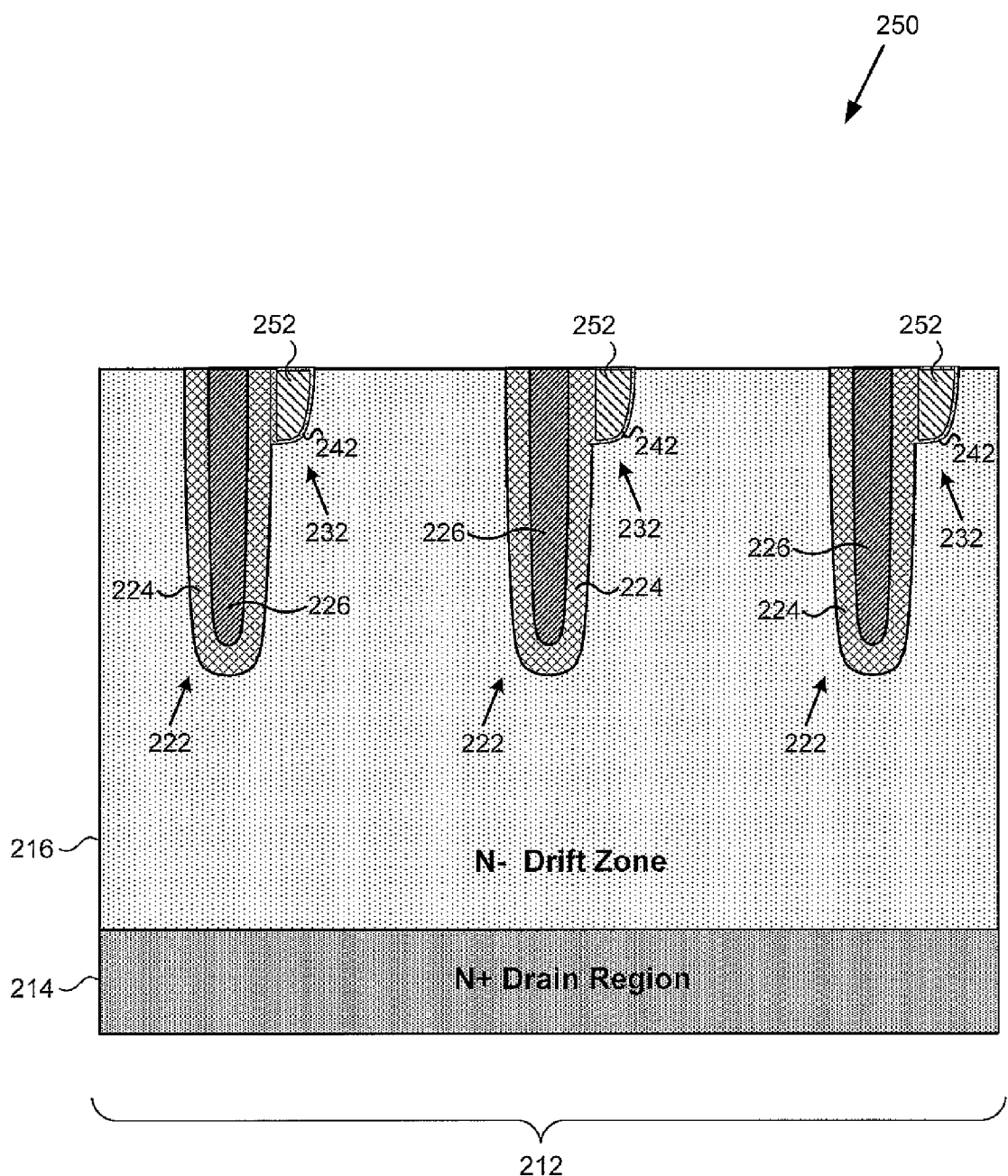
FIG. 2E shows the exemplary structure in FIG. 2D at another intermediate stage of the method described in FIG. 1.

Moving to structure 250 in FIG. 2E, flowchart 100 continues with formation of a gate electrode 252 in each of bordering gate trenches 232 (150). Gate electrodes 252 may be formed of the same material and using the same technique utilized for formation of depletion electrodes 226. That is to say, gate electrodes 252 may be formed of any suitable conductor, such as conductive polysilicon, or metal, for example. Although gate electrodes 252 can be formed of substantially the same material and may be fabricated using substantially the same technique used to form depletion electrodes 226, as noted above, in some implementations it may be advantageous or desirable to form gate electrodes 252 and depletion electrodes 226 using different conductive materials.

For example, in implementations in which gate dielectric 242 is formed as a high-κ dielectric, gate electrodes 252 may be formed of gate metal. Thus, when implemented as part of an NFET, such as an n-channel MOSFET, gate electrodes 252 may be formed of a gate metal suitable for use as an NFET gate. For example, gate electrodes 252 may be formed of tantalum (Ta), tantalum nitride (TaN), titanium nitride (TiN), or other gate metal suitable for utilization in an NFET gate. Alternatively, when implemented as part of a PFET, gate electrodes 252 may be formed of a gate metal suitable for use as a PFET gate. In those implementations, gate electrodes 252 may be formed of molybdenum (Mo), ruthenium (Ru), tantalum carbide nitride (TaCN), for example.

As shown in FIG. 2E, gate electrodes 252 are disposed in gate trenches 232 such that gate dielectric 242 and depletion trench dielectric 224 are merged between depletion electrode 226 and gate electrode 252 formed in the respective gate trench bordering depletion trenches 222. Merger of gate dielectric 242 and depletion trench dielectric 224 to provide gate insulation for gate electrodes 252 results in a reduced capacitance between drift zone 216 and gate electrodes 252 relative to conventional designs. Consequently, the gate charge $Q_g$ of a trench FET, such as a trench MOSFET, fabricated based on the method of flowchart 100 can be expected to be reduced, rendering the MOSFET advantageous for use in high frequency switching applications.

Figure 2F:
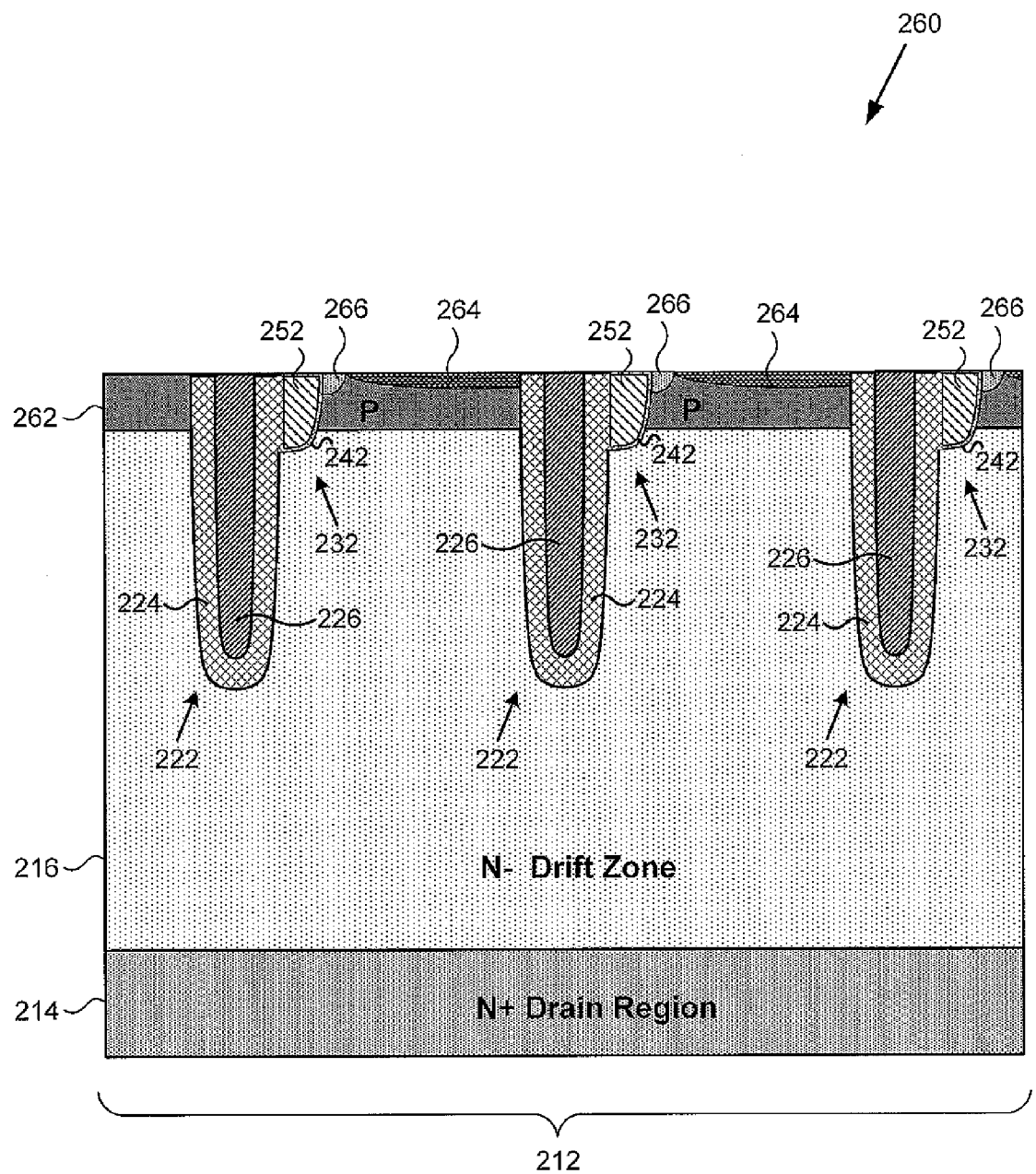
FIG. 2F shows a cross-sectional view of a reduced gate charge trench FET, according to one implementation.

Continuing with the implementation shown by structure 260 in FIG. 2F, flowchart 100 may conclude with formation of channel layer 262, shown as a P type channel layer, channel contacts 264, also P type, and N type source regions 266 (160). As shown in FIG. 2F, channel contacts 264 and N type source regions 266 are formed adjacent each of bordering gate trenches 232.

Channel layer 262 and channel contacts 264 may be formed through implantation and diffusion of a P type dopant, such as boron (B) into semiconductor substrate 212 so as to form channel layer 262 and channel contacts 264 over drift zone 216. Moreover, N type source regions 266 may be formed over drift zone 216 through implantation and diffusion of an N type dopant, such as phosphorus (P) or arsenic (AS), for example. In one exemplary implementation, diffusion of channel layer 262 and channel contacts 264 may be followed by a contact etch which removes N type species implanted in the region occupied by channel contact 264 prior to diffusion of the N type source implant. That contact etch may then be followed by diffusion of the N type source implant to form N type source regions 266.

Depletion electrodes 226 can be used to deplete drift zone 216 when the trench FET implemented using structure 260 is in the blocking state, when depletion electrodes 226 are tied to a low electrical potential, e.g., grounded or at a near ground potential. For example, in one implementation, depletion electrodes 226 may be electrically coupled to a source of the trench FET, such as by being coupled to N type source regions 266. It is noted that electrical connection of depletion electrodes 226 and N type source regions 266 may be implemented using a metal contact layer overlying structure 260 (not shown in FIG. 2F), or may occur in the third dimension with respect to the cross-sectional view shown in FIG. 2F.

Use of depletion electrodes 226 to deplete drift zone 216 can confer several advantages. For example, in one implementation, depletion trenches 222 including depletion electrodes 226 enable structure 260 to sustain a higher breakdown voltage for higher voltage operation. Alternatively, depletion trenches 222 including depletion electrodes 226 can enable an increased conductivity for drift zone 216 while sustaining a desired breakdown voltage. The latter implementation may be desirable because increased conductivity in drift zone 216 is associated with a reduced $R_{dson}$.

For higher voltage operation, such as approximately 80 V to approximately 100 V operation, or higher, a trench FET implementing structure 260 is capable of achieving a lower gate charge $Q_g$ without substantially increasing, and perhaps even decreasing, $R_{dson}$, compared to conventional implementations having a higher channel density. Even in lower voltage implementations such as approximately 20 V to approximately 30 V operation, in which $R_{dson}$ is more sensitive to channel density, structure 260 can advantageously result in reduction of the product $R_{dson}*Q_g$. Thus, a trench FET implemented according to the present inventive principles may achieve a reduced gate charge $Q_g$, while concurrently achieving reduction in the product $R_{dson}*Q_g$.

Thus, by causing a gate dielectric in a gate trench to be merged with a depletion trench dielectric in a depletion trench bordered by the gate trench, a gate insulation can be provided for a gate electrode formed in the bordering gate trench. As a result, the capacitance between the gate electrode and a silicon or other group IV semiconductor layer in which the gate trench is disposed can be reduced. Consequently, the gate charge for the trench FET can be reduced, enhancing performance for virtually all high frequency switching applications. Moreover, in many applications, the implementations disclosed in the present application can also advantageously result in a reduction in the product of on-resistance and gate charge, i.e., $R_{dson}*Q_g$, for the trench FET.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A trench field-effect transistor (trench FET) comprising:
a semiconductor substrate including a drain region and a drift zone over said drain region;
a plurality of depletion trenches over said drain region, each of said plurality of depletion trenches having a depletion trench dielectric and a depletion electrode;
a respective bordering gate trench situated alongside each of said plurality of depletion trenches, each said bordering gate trench having a gate electrode and a gate dielectric;
said gate dielectric being merged with said depletion trench dielectric over said drift zone between said depletion electrode and said gate electrode.

2. The trench FET of claim 1, wherein said gate dielectric is substantially thinner than said depletion trench dielectric.

3. The trench FET of claim 1, wherein said respective bordering gate trench comprises only one bordering gate trench situated alongside each of said plurality of depletion trenches.

4. The trench FET of claim 1, wherein said depletion electrode is electrically coupled to a source of said trench FET.

5. The trench FET of claim 1, wherein said plurality of depletion trenches are at least one and a half times deeper than said respective bordering gate trench.

6. The trench FET of claim 1, further comprising a channel layer including source regions formed over said drift zone.

7. The trench FET of claim 1, wherein said drift zone comprises an epitaxial silicon layer.

8. The trench FET of claim 1, wherein at least one of said gate dielectric and said depletion trench dielectric comprises silicon oxide.

9. The trench FET of claim 1, wherein said gate dielectric comprises a high-κ dielectric.

10. The trench FET of claim 1, wherein said trench FET is an n-channel FET.

* * * * *